March 28, 1961 A. B. SLATER 2,977,466

SIGNAL SEEKING TUNERS

Filed May 29, 1958

INVENTOR
ARTHUR B. SLATER
BY H. Vincent Harsha
ATTORNEY

United States Patent Office 2,977,466

Patented Mar. 28, 1961

2,977,466

SIGNAL SEEKING TUNERS

Arthur B. Slater, Lexington, Mass., assignor to Raytheon Company, a corporation of Delaware Filed May 29, 1958, Ser. No. 738,814

9 Claims. (Cl. 250—20)

This invention relates to automatic tuning means for radio receiving apparatus, usually referred to as signal actuated tuners or signal seeking tuners, and more particularly, to frequency control and signal locking circuits for tuning the receiver over the spectrum of the band to be received and for locking said receiver at the carrier frequency of an incoming signal.

In signal seeking tuners in which a driving means is provided to tune a superheterodyne receiver over a predetermined frequency band, a frequency control voltage is often provided to de-energize the driving means and to lock said tuning means near the center freqeuncy of a frequency sensing device, such as a discriminator. As is known, the intermediate frequency gain is maximum at the center frequency. Such a system is normally adjusted to provide a stable lock on the difference signal produced by tuning the local oscillator to the carrier frequency plus the intermediate frequency. However, in some instances the local oscillator of said tuning system locks on the lower or undesired side of the carrier and the resulting signal in the IF amplifier will be frequency controlled away from the highest gain portion of the discriminator response curve. In particular, when a lock is achieved on the undesired or lower side of the carrier frequency minus the intermediate frequency, the discriminator slope is reversed and the automatic frequency control voltage fed to the scanning means becomes regenerative and no longer holds the local oscillator to the center frequency. In this instance, the local oscillator becomes tuned or controlled away from the center frequency until the signal or lock is lost and the undesirable scanning and locking process repeats itself. While a dual discriminator circuit and other phase-sensing means have been used to detect the phase of the discriminator slope prior to lock and to select the slope corresponding to the desired carrier frequency plus the intermediate frequency, it is desirable in certain applications to provide a simple lock circuit which will permit the lock to occur on either side of the carrier and to provide a means for momentarily disabling the locking device following a lock on the wrong side of the carrier.

It is further desirable to provide a simple automatic frequency controlled scanning circuit of the relay type which will lock when the signal scanning occurs in either direction and at the same time provide a stable lock on the side of the discriminator where IF gain is maximum.

In accordance with the signal searching system of this invention, a relay circuit and control tube are provided to disable the automatic frequency control loop of a stop-on signal superheterodyne receiver following a loss of signal in the IF amplifier. A delay storage circuit is fed by the local oscillator tuning motor voltage to disable the control tube for the locking circuit long enough to permit the local oscillator scanning motor to sweep the local oscillator beyond the frequency of the undesirable lock signal. In other words, the lock or oscillator tuning motor voltage is utilized to unlock the automatic frequency control voltage after a single challenge at the improper frequency. The delay circuit, which is fed by the tuning motor voltage, is provided with a conednser which charges through a resistor for a predetermined length of time. When the condenser becomes charged by the tuning motor voltage following a loss of signal and an unlock, the condenser voltage is thereafter fed to the control tube. By relay action the control tube disables the automatic frequency control voltage to the local oscillator for a sufficient time to permit the tuner to scan beyond the incorrect signal. Further advantages and features of the invention will become apparent as the description progresses, reference being made to the accompanying drawing wherein:

Figure 1:
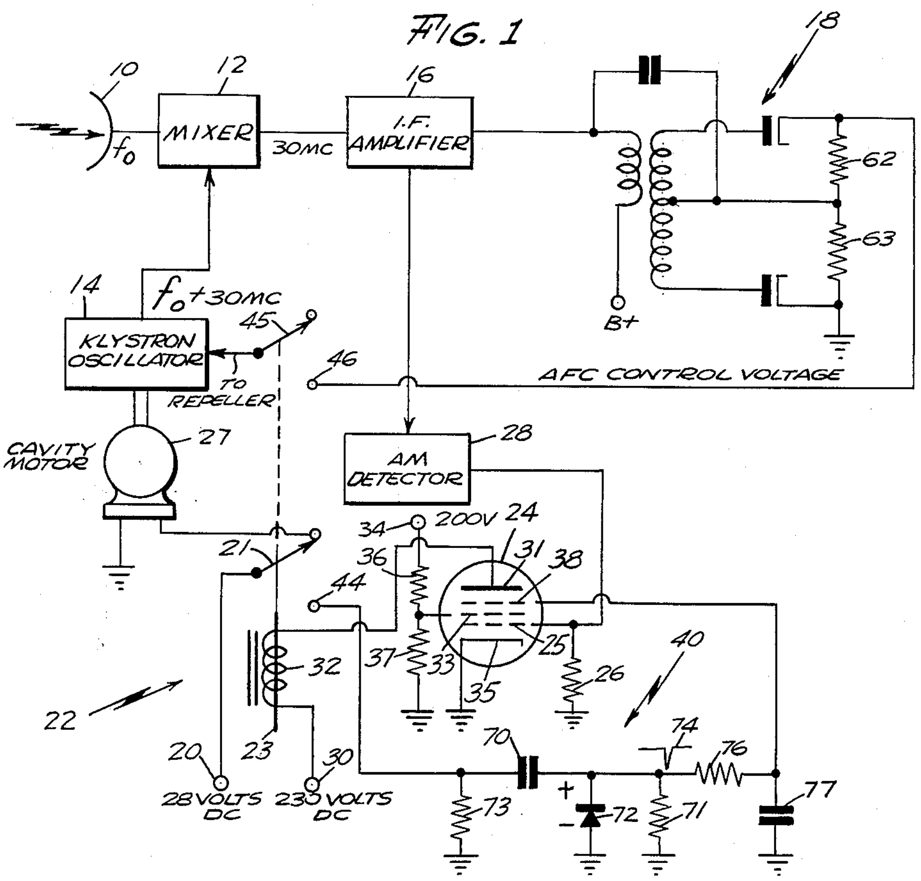
Fig. 1 is a circuit diagram embodying one form of the invention applied to a normal signal-searching system.

Referring now to Fig.1, there is shown a signal-seeking system consisting of an antenna 10 adapted to receive a carrier signal, referred to as $f_0$. The carrier is fed to a mixer 12 where it is heterodyned or compared with a cavity tuning oscillator 14 to produce a difference freqeuncy, for example, 30 megacycles. This difference signal is fed to an intermediate frequency amplifier 16 of the broad band type. The output of the intermediate frequency amplifier is then fed to a discriminator 18 which may be of the well-known Foster-Seely type, as is illustrated, for example, in U.S. Patent No. 2,121,103. The direct current output of the discriminator is used as an automatic frequency control voltage. This voltage is fed to the repeller electrode of the klystron oscillator 14 when switch 45 is at contact 46 to tune the oscillator to a frequency difference corresponding to the desired center frequency, which frequency is selected 30 megacycles above the carrier frequency, $f_0$, of the desired incoming signal.

A 28-volt source of direct current is supplied at terminal 20 and is connected by way of relay switch 21 of a relay 22 to a direct current cavity tuning motor 24 which scans the klystron oscillator forward and backward in a known manner over a predetermined wide spectrum. The operation of the relay 22 is controlled by solenoid 23 and winding 32 in the plate circuit of a 5784-type control tube 24. Control tube 24 is provided with a control grid 25 which is connected to bias resistor 26 and the amplitude-modulated output of detector 28. The output of IF amplifier 16 is fed to detector 28 and applies a positive voltage to the grid 25 of control tube 24 whenever an incoming signal is detected, regardless of the frequency or phase of said signal.

During the time when the signal seeking system is locked on a particular incoming signal, the double-pole double-throw relay 22 is energized by a 230-volt source of direct current connected to terminal 30. This voltage is applied to plate 31 of control tube 24 by way of relay winding 32. A second grid 33 of control tube 24 is biased with a positive source of voltage of 200 volts applied to terminal 34. The voltage source is connected to one hundred thousand ohm voltage divider resistors 36 and 37 adapted to apply approximately 100 volts to grid 33. A third grid 38 is connected to the output of the novel delay circuit 40 which produces a negative voltage to cut off the control tube 24 for a predetermined time after a lock followed by an unlock. This delay circuit 40 is energized by the cavity motor voltage at terminal 20 whenever an incoming signal to the grid 25 of the control tube causes current to flow in relay winding 32, plate 31 and cathode 35. This increased current flow due to the conduction of tube 24 causes relay arm 21 to engage relay terminal 44 and relay arm 45 to engage relay terminal 46, thereby applying the output control voltage from discriminator 18 to the repeller electrode of klystron oscillator 14 and removing the 28 volts direct current from the cavity tuning motor.

Figure 2:
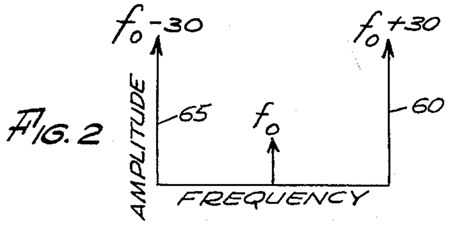
Fig. 2 is a graph showing the carrier frequency and the discriminator slope corresponding to each intermediate frequency above and below the carrier frequency.
Figure 2A:
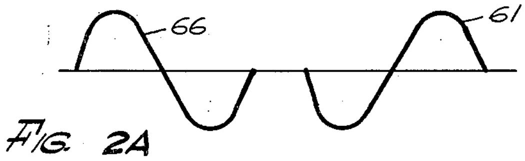

It should be noted that when a signal is encountered, the A.M. detector 28 feeds a positive voltage to the grid 25 of control tube 24 and the double-pole double-throw relay disables the cavity tuning motor 27 near the frequency of the incoming signal. At the same time, the automatic frequency control voltage is applied to the repeller of klystron oscillator 14 in order to tune the discriminator to the center of the incoming signal. If the klystron oscillator is sweeping in a direction which approaches the frequency, $f_0$ plus 30 megacycles, as represented at 60 in Fig. 2, the slope of discriminator 18 will occur as shown at 61 of Fig. 2*a*. The control voltage produced across resistors 62 and 63 of discriminator 18 is then phased in a manner to control the oscillator toward the center frequency. In this case, a stable lock is achieved and the receiver is maintained on the center frequency of the incoming signal. However, if the cavity motor tunes the oscillator 14 to the frequency, $f_0$ minus 30 megacycles, as shown at 65 of Fig. 2, the output slope of the discriminator will be as shown at 66 in Fig. 2*a*. In this case, the automatic frequency control voltage will sweep the oscillator away from the center frequency until the signal in the A.M. detector 28 is lost. The cavity motor will then be enrgized and another sweep will occur until the incorrect signal is again challenged. This undesirable cycle will repeat itself and the cavity motor will be unable to tune beyond this incorrect image frequency without the interposition of the delay circuit 40 which operates in the following manner.

When the signal is lost by the automatic frequency control voltage tuning the oscillator away from the correct center frequency, the 28-volt source at terminal 20 is connected to terminal 44 of relay 22. The storage capacitor 70 of the delay circuit commences charging through diode 72 until charged to 28 volts. When the relay arm 21 returns to the normal position to energize cavity motor 27, the condenser 70 discharges in the opposite direction through ten thousand ohm resistor 73 and one hundred thousand ohm resistor 71 to produce a negative voltage spike, as shown at 74. This voltage is integrated by a one-megohm resistor 76 and a .1 microfarad condenser 77 connected to the third grid 38 of control tube 24. The negative voltage applied to grid 38 holds the control tube 24 in a cut-off condition and disables the automatic frequency control voltage until the cavity motor 27 tunes the oscillator beyond the incorrect frequency, $f_0$ minus 30 megacycles. By this time the .005 microfarad condenser 70 has become discharged and the delay circuit will not become activated until the oscillator is again tuned to the improper image frequency. In this manner, the delay circuit is not disabled until the signal lock is lost, which only occurs after the reception of an incoming signal.

Figure 3:
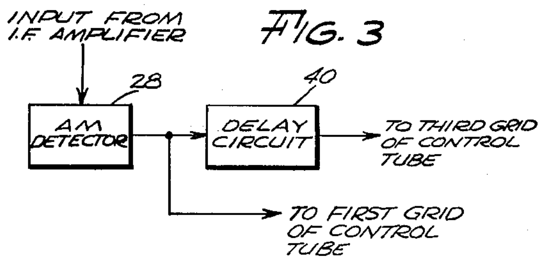
Fig. 3 is a block diagram showing another embodiment of the invention as illustrated in Fig. 1.

The capacitor 70 may be made small enough to provide several challenges before the charge on condenser 77 becomes large enough to cut off the plate circuit of control tube 24 and open the relay 22. Thus, by making capacitor 70 approximately .001 microfarad an incoming signal may be challenged several times to determine wherther it is a signal having continuity or an instantaneous noise burst. Referring now to Fig. 3, another embodiment of the signal seeking receiver is shown. In this instance, the delay circuit 40 is connected between the detector 28 and the grid 38 of control tube 24, thereby eliminating a separate 28-volt source of direct current to charge capacitor 70. When the oscillator 14 is tuned away from the correct center frequency and lock is lost, the delay circuit 40 differentiates the incorrect signal envelope of detector 28 and stores the differentiated signal for a period long enough to permit the cavity motor 27 to tune beyond the frequency of the incorrect signal. At this time, the condenser 77 discharges sufficiently to permit the control tube to become responsive to positive signals applied to grid 25 from detector 28 and the receiver to be scanned until further signals enter the discriminator 18. In this manner, the automatic frequency control loop is prevented from continuously locking on the image side of the carrier, rather than on the correct side of the carrier frequency, as a result, phase-sensing circuits to detect the phase of the discriminator slope prior to lock are eliminated.

It should be understood that this invention is not limited to the particular details of construction, materials and process described as many equivalents will suggest themselves to those skilled in the art. For example, any arrangement capable of disabling a locking system for a predetermined time after an incorrect locking sequence may be used. It is, accordingly, desired that this invention not be limited to the particular details of the embodiment disclosed herein except as defined in the appended claims.

What is claimed is:

1. A signal-seeking receiver system comprising tuning means, means for locking said tuning means to an incoming signal, an automatic frequency control loop circuit for controlling said tuning means, said automatic frequency control loop circuit including a local oscillator, a mixer fed by said local oscillator to produce a difference signal, a discriminator adapted to produce a control voltage in response to said difference signal, said control voltage phased to control said local oscillator away from the center frequency of said incoming signal by the amount of said difference signal when said tuning means is tuned a first predetermined frequency from said incoming signal, and means to disable said automatic frequency control loop for a predetermined time after said tuning means has become unlocked from a signal a second predetermined frequency from said incoming signal.

2. In a signal-seeking receiver, the combination including tuning means, controllable driving means connected to said tuning means, means for locking said tuning means away from the carrier frequency of an incoming signal by the amount of an intermediate frequency, said tuning means including a control tube having an anode, a control grid and an auxiliary grid, means for varying the potential to said control grid of said control tube in response to said incoming signal, thereby to disable said driving means to provide a first lock, and signal delay means in circuit with said auxiliary grid for preventing a second locking of said tuning means for a predetermined time after resumption of operation of said driving means following said first lock.

3. A signal-seeking receiver system comprising a mixer adapted to be fed by signals to be received, a local oscillator feeding said mixer to produce a difference signal, tuning means adapted to vary said local oscillator over a predetermined frequency spectrum, a closed loop circuit including a discriminator adapted to produce in response to said difference signal, a frequency control voltage phased to lock said local oscillator to a received signal, an amplitude modulation detector fed by said difference signal to produce an output voltage, control means for applying said frequency control voltage to said local oscillator in response to said output voltage of said amplitude modulation detector, said control means adapted to disable said tuning means in response to said output voltage to provide a first lock, and delay means cooperating with said control means to prevent application of said frequency control voltage to said local oscillator for a predetermined time after resumption of operation of said driving means following said first lock.

4. A signal seeking receiver system having tuning means to repetitively scan the frequency spectrum, controllable driving means for controlling said tuning means detector, a control tube connected to said detector upon which a first voltage is developed upon receipt of any signal in said detector, means responsive to said control tube for applying a second voltage to said driving means to direct said tuning means away from the center frequency of said incoming signal by the amount of an intermediate frequency when said tuning means is tuned a first predetermined frequency from said incoming signal, and means including a delay circuit to disable said control tube for a predetermined time upon failure of said driving means to maintain said tuning means at said intermediate frequency from said center frequency.

5. A signal seeking receiver system comprising a mixer adapted to be fed by signals to be received, a local oscillator feeding said mixer to produce a difference signal, controllable driving means adapted to vary said local oscillator over a predetermined frequency spectrum, a closed loop circuit including a discriminator adapted to produce in response to said difference signal a frequency control voltage phased to lock said local oscillator to a received signal, a detector fed by said difference signal to produce an output voltage, control means responsive to said output voltage of said detector for applying said frequency control voltage to said local oscillator, said control means adapted to disable said driving means in response to said output voltage, and delay means in circuit with said detector and said control means to prevent application of said frequency control voltage to said local oscillator for a predetermined time after resumption of operation of said driving means following said first lock.

6. A signal-seeking receiver system comprising tuning means adapted to scan a predetermined frequency spectrum, an automatic frequency control circuit for controlling said tuning means in response to an incoming signal, a detector to produce an output voltage in response to the incoming signal, said automatic frequency control circuit including a discriminator adapted to produce a control voltage of a predetermined slope, said tuning means responsive to said control voltage to remain away from the center frequency of said incoming signal by the amount of an intermediate frequency, and means to disable said automatic frequency control circuit for a predetermined time after said tuning means has become unlocked in response to a control voltage of a slope other than the slope of said first recited control voltage.

7. A signal-seeking receiver system comprising tuning means, an automatic frequency control circuit for controlling the operation of said tuning means in response to an incoming carrier, said automatic frequency control circuit including a local oscillator, a mixer fed by said local oscillator to produce a difference signal, a detector fed by said difference signal to produce an output voltage, a discriminator adapted to produce a control voltage in response to said difference signal, said local oscillator adapted to be tuned toward the center frequency of said incoming carrier in response to a predetermined slope of said control voltage, and means including said output voltage to disable said automatic frequency control circuit for a predetermined time in response to a slope of said control voltage other than said predetermined slope.

8. In a signal-seeking receiver, the combination including tuning means, controllable driving means connected to said tuning means, means for locking said tuning means at the carrier frequency of an incoming signal, said tuning means including an amplifier control circuit, means for varying the potential to said amplifier control circuit in response to said incoming signal, thereby to disable said driving means to provide a first lock, and signal delay means in circuit with said amplifier control circuit for preventing a second locking of said tuning means for a predetermined time after resumption of operation of said driving means following said first lock.

9. A signal-seeking receiver system comprising a superhetrodyne receiver including a detector, a local oscillator and tuning means to repetitively scan the frequency spectrum driving, means for controlling said tuning means to tune said receiver to an incoming signal, a control tube upon which a voltage is developed upon receipt of said signal in the detector of said receiver, relay means responsive to the output of said control tube for applying a control voltage to said tuning means to lock said tuning means to the center frequency of said incoming signal, and delay means to disable for a predetermined time said relay means from applying said control voltage to said tuning means upon failure of said driving means to maintain said tuning means locked at said center frequency.

References Cited in the file of this patent

UNITED STATES PATENTS

| | | |
|---|---|---|
| 2,434,294 | Ginzton | Jan. 13, 1948 |
| 2,783,383 | Robins | Feb. 26, 1957 |
| 2,852,669 | Ashby | Sept. 16, 1958 |
| 2,896,018 | Rhodes | July 21, 1959 |